United States Patent
Shaw et al.

(10) Patent No.: US 12,323,153 B2
(45) Date of Patent: Jun. 3, 2025

(54) WIRELESS PER-FRAME-BASED LOCAL OSCILLATOR TRIMMING FOR UPLINK MULTI-USER TRANSMISSION

(71) Applicant: Cypress Semiconductor Corporation, San Jose, CA (US)

(72) Inventors: Amit Shaw, Bangalore (IN); Nutan Reddy Annapu Reddy, Hyderabad (IN)

(73) Assignee: Cypress Semiconductor Corporation, San Jose, CA (US)

( * ) Notice: Subject to any disclaimer, the term of this patent is extended or adjusted under 35 U.S.C. 154(b) by 61 days.

(21) Appl. No.: 18/336,640

(22) Filed: Jun. 16, 2023

(65) Prior Publication Data

US 2024/0421824 A1    Dec. 19, 2024

(51) Int. Cl.
*H04L 27/28* (2006.01)
*H03L 7/07* (2006.01)
*H04L 27/26* (2006.01)

(52) U.S. Cl.
CPC ............ *H03L 7/07* (2013.01); *H04L 27/2657* (2013.01)

(58) Field of Classification Search
CPC .............. H04B 7/0617; H04B 7/086; H04L 2027/0016; H04L 2027/0018; H04L 27/014; H04L 2027/0067; H04L 27/2657; H04L 2027/0026; H04L 27/152; H04W 56/0035; H04W 56/005

USPC ................................ 375/260, 262, 267, 376
See application file for complete search history.

(56) References Cited

U.S. PATENT DOCUMENTS

| | | | |
|---|---|---|---|
| 9,641,368 B2* | 5/2017 | Liu ......................... | H04L 27/22 |
| 2008/0298453 A1* | 12/2008 | Lerner .................. | H04L 27/389 |
| | | | 375/233 |
| 2013/0106641 A1* | 5/2013 | Warke .................. | H04L 27/0014 |
| | | | 342/21 |
| 2013/0329721 A1* | 12/2013 | Doetsch .............. | H04L 27/2672 |
| | | | 370/350 |
| 2018/0146443 A1* | 5/2018 | Park ...................... | H04L 43/106 |
| 2019/0115902 A1* | 4/2019 | Taori ..................... | H04W 16/10 |
| 2020/0326403 A1* | 10/2020 | Romme .............. | G01S 5/02685 |
| 2024/0030946 A1* | 1/2024 | Wilcox ................... | H04B 1/04 |

* cited by examiner

*Primary Examiner* — Khai Tran

(57) ABSTRACT

A wireless device includes a radio having a front end and a first local oscillator (LO) and control logic coupled to the radio. The control logic determines, from a received trigger frame, a carrier frequency offset (CFO) between a first carrier frequency of the first LO and a second carrier frequency of a second LO of an access point operating in a multi-user transmission mode. The control logic triggers, based on the CFO, an LO trim of the first LO to adjust the first carrier frequency to match, within a threshold tolerance, the second carrier frequency. The radio can then transmit, to the access point, a protocol data unit frame using the trimmed first LO, the protocol data unit frame being associated with the multi-user transmission mode.

20 Claims, 13 Drawing Sheets

WIRELESS PER-FRAME-BASED LOCAL OSCILLATOR TRIMMING FOR UPLINK MULTI-USER TRANSMISSION

TECHNICAL FIELD

This disclosure relates to wireless devices and, more specifically, to wireless per-frame-based local oscillator trimming for uplink multi-user transmission.

BACKGROUND

Wireless local area network (LAN) technology has evolved to the point that wireless devices can communicate with very high throughput, high efficiency, and support both multi-user (MU) orthogonal frequency division multiple access (OFDMA) and multi-user multiple-input and multiple output (MU-MIMO) in both the downlink and the uplink directions. Because an access point (AP) or base station (BS) in uplink transmissions under these Wi-Fi™ 6 technologies require stringent levels of timing synchronization, power control for a target receive power, and a high signal quality from multiple transmission devices, support for MU OFDMA and MU-MIMO in the uplink direction has put stringent requirements (compared to legacy methods) on transmission devices. These stringent Wi-Fi™ 6 requirements include those related to in-band distortions, e.g., error vector magnitude (EVM), and out-band distortions, e.g., unused tone error (UTE) and carrier frequency offset (CFO) with respect to the AP/BS. This in turn puts stringent requirements on carrier leakage from trigger-based physical layer protocol data unit (TB-PPDU) frames received from the transmission devices. While the standard associated with Wi-Fi™ 6 states that transmission devices have to pre-correct for in-band and out-of-band distortions to meet these stringent standard levels for EVM, UTE, and CFO, the standard does not teach how this is to be done practically by such transmission devices.

DETAILED DESCRIPTION

Figure 1:
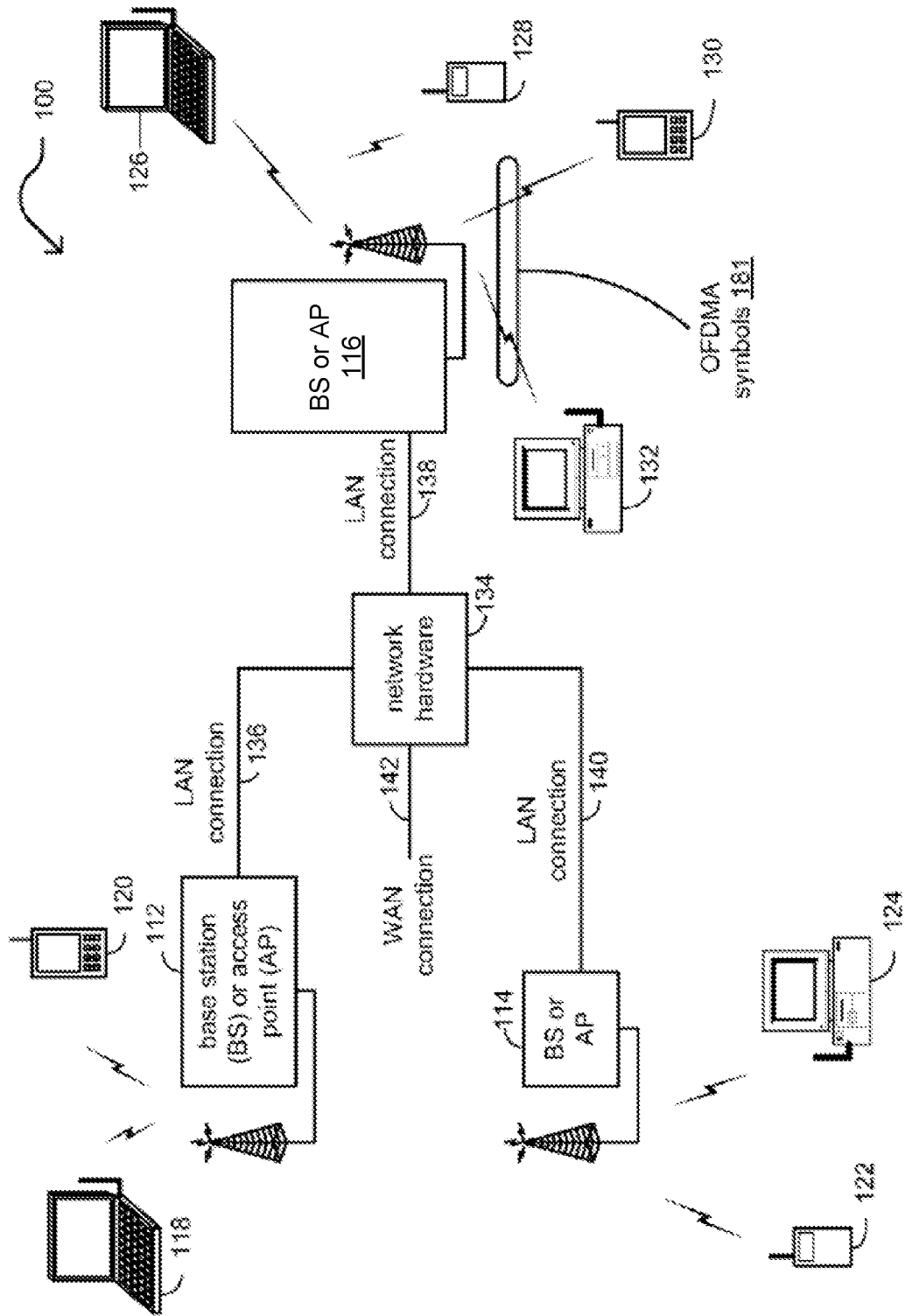
FIG. 1 is a block diagram of an exemplary wireless communication system according to some embodiments.

The following description sets forth numerous specific details such as examples of specific systems, devices, components, methods, and so forth, in order to provide a good understanding of various embodiments of wireless per-frame-based local oscillator trimming for uplink multi-user transmission. Wireless LAN devices have evolved over generations. For example, the first two generations of the Wi-Fi™ standard was based on the single carrier spread spectrum technique, while later generations adopted a more efficient ODFM as the basic modulation technique. Still later generations added support for multiple antenna technology, e.g., MIMO, to enhance reliability and throughput using spatial dimension as redundancy and multiplexing, for example. However, the access mechanism has been using carrier sense multiple access with collision avoidance (CDMA-CA) and a random back-off as the access mechanism to share a medium or channel across users. This meant only a single user (SU) can use the medium or channel at any time instance.

Still more recent Institute of Electrical and Electronics Engineers (IEEE) 802.11ac standard, also referred to as very high throughput (VHT) or Wi-Fi™ 5, added support for multi-user (MU) capability in the downlink direction using MU-MIMO technique. This has allowed multiple users to share the medium at one time instance, e.g., by being multiplexed together. Most recently, the IEEE 802.11ax standard, also referred to as high efficiency (HE) or WiFi 6, added multi-user (MU) support in both uplink and downlink directions using OFDMA and MU-MIMO techniques. For these most recent standards, on the downlink side, access point (AP) or base station (BS) frame synchronization is a default, point-to-multi-point transmission, e.g., because the AP/BS is just sending content to individual wireless devices as the content is received generally by multiplexing various content to the correct wireless device. On the uplink side, in contrast, the AP/BS is configured to receive transmissions from multiple wireless devices (multi-point-to-point) so that the AP/BS receives the content correctly when concurrently receiving multiple streams from multiple devices that are to then be transmitted. This requires synchronization among the multiple wireless devices.

As was mentioned, stringent Wi-Fi™ 6 requirements for uplink transmission include those related to in-band distortions, e.g., error vector magnitude (EVM), and out-band distortions, e.g., unused tone error (UTE) and carrier frequency offset (CFO) with respect to the AP/BS. This in turn puts stringent requirements on carrier leakage within the access point from the TB-PPDU frames received from the transmission devices. While the standard associated with Wi-Fi™ 6 states that transmission devices have to pre-correct for in-band and out-of-band distortions to meet these stringent standard levels for EVM, UTE, and CFO, the Wi-Fi™ 6 standard does not teach how this is to be done practically by transmission devices. As will be discussed in more detail, while current digital pre-correction techniques improve (e.g., decrease) carrier leakage, they do not do so to the level that is now required under the most recent WiFi™ standards.

To resolve these and other deficiencies with known approaches to carrier leakage reduction, the present disclosure sets forth configuring and/or operating wireless devices to instead (or in addition to performing digital pre-correction) perform a local oscillator (LO) trim to a carrier frequency of transmission devices. By directly adjusting the LO within the circuitry of the radio of these transmission wireless devices, their carrier frequencies can undergo larger adjustments and better meet the stringent standard levels for EVM, UTE, and CFO.

Thus, in at least some embodiments, a wireless device is disclosed that employs a radio with a first LO, e.g., such as may be employed within or by a radio frequency (RF) phase-locked loop (PLL). For example, the RF PLL may include a type of voltage-controlled oscillator (VCO) operating at a frequency that is adjustable by changing an input voltage to the VCO according to reference input and feedback voltages of the PLL. In these embodiments, the wireless device further employs control logic to determine, from a trigger frame received from the AP/BS, a carrier frequency offset (CFO) between a first carrier frequency of the first LO and a second carrier frequency of a second LO of an access point or base station (AP or BS) operating in a multi-user transmission mode. In embodiments, the control logic triggers, based on the CFO, an LO trim of the first LO to adjust the first carrier frequency to match, within a threshold tolerance, the second carrier frequency. In these embodiments, the radio transmits, to the AP/BS, a protocol data unit frame (e.g., TB-PPDU) using the trimmed first LO, the protocol data unit frame being associated with the multi-user transmission mode.

In various embodiments, the control logic is implemented in at least one of a microcontroller or hardware, as will be discussed in more detail. In at least some embodiments, the control logic continuously triggers the LO trim of the first LO on a per-frame basis in response to detecting changes to the CFO during transmission of multiple protocol data unit frames to one or more access points (APs or BSs). Additional embodiments and variations in implementation will be discussed in detail with reference to FIGS. 2-14.

The present disclosure includes a number of advantages, including the ability to take care of carrier frequency offset (CFO) by directly updating the LO frequency at which radio circuitry operates based on an estimated CFO determined from a preceding trigger frame on a per packet basis. This approach also relaxes requirements on residual carrier leakage to be able to meet UTE requirements. Mixed with digital pre-correction, implemented for fine carrier frequency adjustments, direct LO trims within wireless radios may implement coarse carrier frequency adjustments, enabling a wider range of potential frequency modifications to at least meet the stringent standard levels for EVM, UTE, and CFO. Additional advantages will be apparent to those skilled in the art of modern wireless technologies and recent IEEE standards.

FIG. 1 is a block diagram of an exemplary wireless communication system 100 according to some embodiments. In these embodiments, the wireless communication system 100 includes base stations and/or access points 112-116 (which can be referred to interchangeably herein), wireless devices 118-132 (e.g., wireless stations (STAs) and other such wireless communication devices), and a network hardware component 134. The wireless devices 118-132 may be include laptop computers 118 or tablets 126, personal digital assistants 120 and 130, personal computers 124 and 132, and/or cellular telephones 122 and 128. The details of an embodiment of such wireless devices when acting as transmission devices are described in greater detail hereinafter.

In embodiments, the base stations (BSs) or access points (APs) 112-116 are operably coupled to the network hardware component 134 via local area network connections 136, 138, and 140. The network hardware component 134, which may be a router, switch, bridge, modem, system controller, etc., provides a wide area network connection 142 for the communication system 100. Each of the base stations or access points 112-116 has an associated antenna or antenna array to communicate with the wireless communication devices in an area reachable by each respective base station or access point. Typically, the wireless devices register with a particular base station or access point 112-116 to receive services from the communication system 100. For direct connections (i.e., point-to-point communications), wireless communication devices communicate directly via an allocated channel.

Any of the various wireless devices 118-132 and BSs or APs 112-116 may include a processor and a communication interface to support communications with any other of the wireless devices 118-132 and BSs or APs 112-116. In an example of operation, a processor and the communication interface implemented within one of the devices (e.g., any one of the wireless devices 118-132 and BSs or APs 112-116) are configured to process at least one signal received from and/or to generate at least one signal to be transmitted to another one of the devices (e.g., any other one of the wireless devices 118-132 and BSs or APs 112-116).

Note that general reference to a communication device, such as a wireless device (e.g., wireless devices) 118-132 and BSs or APs 112-116 in FIG. 1, or any other communication devices and/or wireless communication devices may alternatively be made generally herein using the term 'device' for brevity. The processor and the communication interface of any one of the various devices, wireless devices 118-132 and BSs or APs 112-116, may be configured to support communications with any other of the various devices, wireless devices 118-132 and BSs or APs 112-116. Such communications may be unidirectional or bidirectional between devices. Also, such communications may be unidirectional between devices at one time and bidirectional between those devices at another time, although the embodiments herein are generally focused on wireless devices transmitting to a BS or AP 112-116 operating in a multi-user transmission mode such as MU OFDMA or MU-MIMO.

In an example of operation, the AP/BS device 116 (representative of any of the BS or AP 112-116) includes a communication interface and a processor that are configured to receive one or more signals (e.g., OFDMA symbols 181) from devices 130 and 132. Considering an OFDMA example, device 130 uses a first at least one sub-carrier, and device 132 uses a second at least one sub-carrier. Generally, different subsets of sub-carriers are assigned for use by different devices. Such assignment may be dynamic, adaptive, etc. for different devices for different symbols and/or at different times.

In these embodiments, the AP/BS device 116 receives a first OFDMA symbol that includes first data from the device 130 modulated on a first set of at least one sub-carrier and second data from the device 132 modulated on a second set of at least one sub-carrier. The AP/BS device 116 processes the first data to decode (or demodulate) the data from the first device 130. The AP/BS device 116 also processes the second data to decode (or demodulate) the data from the second device 132. In other instance/embodiments, the AP/BS device 116 receives a first MU-MIMO symbol that includes first data from the device 130 modulated on a first set of at least one sub-carrier and second data from the device 132 modulated on a first set of at least one sub-carrier. The AP/BS device 116 spatially processes the first data to decode (or demodulate) the data from the first device 130. The AP/BS device 116 also spatially processes the second data to decode (or demodulate) the data from the second device 132. In both instances, first device 130 and second device 132 send data with the precorrected CFO that the first and second devices 130 and 132 estimate based on the trigger frame that precedes the data frame. Such capability within first and second devices 130 and 132 may generally be referred to as CFO precorrection capability. With respect to this embodiment and other embodiments or examples provided herein, there may be instances in which the pre-corrected CFO results in a zero offset between the AP/BS device 116 and another device similar to devices 130 and 132 (e.g. devices 126 or 128).

Generally, the AP/BS device 116 operates by processing data from another device that is included within the same set of at least one sub-carrier. A number of different combinations of such data and copies and/or repeats of that data may be used in various embodiments. When the other device precorrects the CFO the other device, similar to devices 130 and 132 above, modifies or adapts communications to and/or from that device to compensate for any CFO that may exist between the AP/BS device 116 and the other device to ensure effective communications, synchronization, and improved performance of the communications between the devices.

Figure 2:
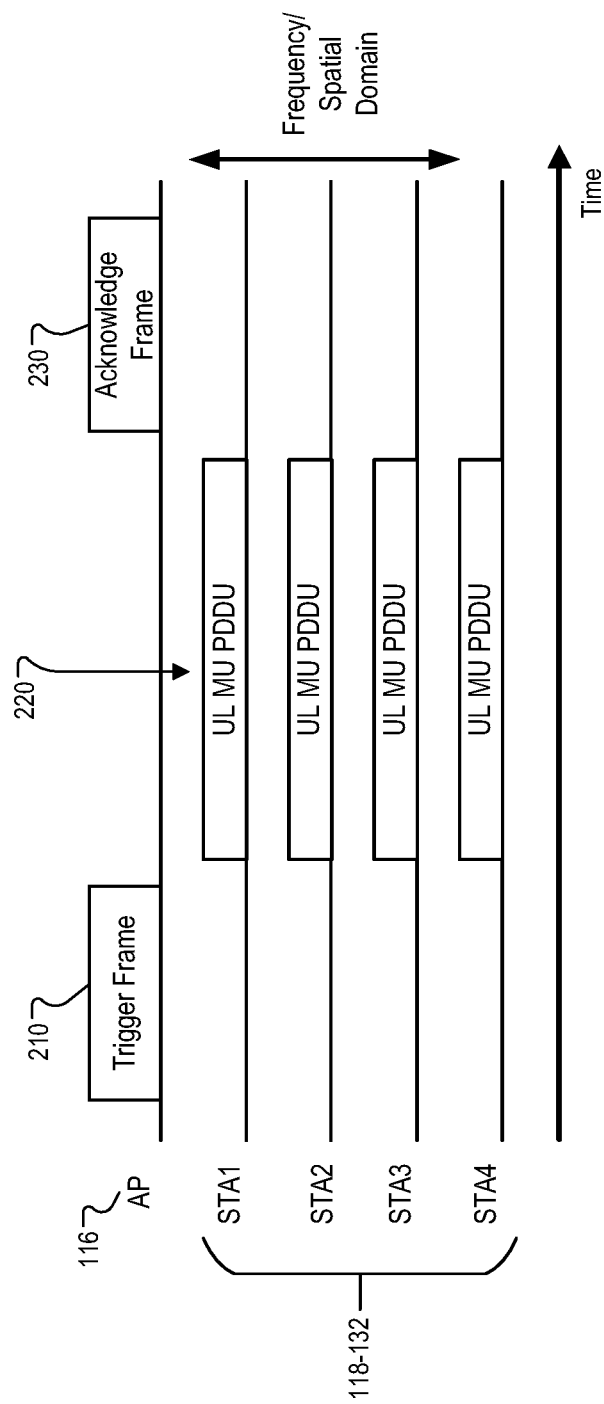
FIG. 2 is a simplified graph illustrating several wireless devices (stations) in an uplink MU transmission (MU-MIMO or OFDMA) according to an example embodiment.

FIG. 2 is a simplified graph illustrating several wireless devices (stations) in an uplink MU transmission (MU-MIMO or OFDMA) according to an example embodiment. For example, the stations are labeled STA1 through STA4, which can generally represent any of the wireless devices 118-132 operating within a frequency and spatial domain. With OFDMA, for example, the channel bandwidth is divided into resource units (RUs) of various sizes. The size of an RU can vary from the smallest 26 subcarriers (or 2 megahertz (MHz)) up to 996 tones (or 77.8 MHz). The size and the location of the RUs is defined for 20 MHz, 40 MHz, 80 MHz channels, and 80+80 or 160 MHz channels.

In various embodiments, these RUs are employed for data subcarriers used to carry data information and form the majority of the subcarrier's assignment, pilot subcarriers used for phase tracking for channel estimation, direct current (DC) subcarriers at the center frequency of the channel, and guard band/null subcarriers used at the band edges to protect from interference from neighboring RUs. Different numbers and sizes of RUs can be allocated for transmissions to different users, based on how much data each station needs. In embodiments, the AP/BS device 116 is responsible for RU assignment and coordination. For example, applications that require a lot of data, like streaming video, can be assigned a large RU, while applications that require very little data can be assigned a small RU. Each RU can use a different modulation scheme, coding rate and level, and RU assignments can vary on a frame by frame basis.

In embodiments, OFDMA uplink transmissions are more complex than downlink operations, because in the uplink transmission, the traffic is transmitted simultaneously from multiple stations to the AP/BS device 116. In the uplink transmission, the AP/BS device 116 acts as an operations and transmission coordinator. First, the AP/BS device 116 sends a trigger frame 210 to all the stations (e.g., STA1, STA2, STA3, STA4) that will be involved in the upcoming transmission. In these embodiments, these stations transmit simultaneously on their respective RUs in response to the trigger frame, e.g., transmit an uplink (UP) MU PDDU frame 220. Responsive to receiving the UP MU PDDU frames 220, the AP/BS device 116 transmits an acknowledge frame 230 back to the respective stations.

In various embodiments, based on the trigger frame 210, each client station tunes its timing, frequency, and power levels to participate in this transmission. The tuning of the carrier frequency is the particular adjustment of emphasis in this disclosure. In the current IEEE standards, client stations participating in an OFDMA transmission are required to transmit within 400 nanoseconds (ns) of each other. In order to synchronize the clients, the AP/BS device 116 transmits the trigger frame 210. This frame contains information about the OFDMA sub-carrier's RU assigned to each station. In response, the participating clients need to start transmission of the uplink signal after a specified time interval short inter-frame space (SIFS) of 16 microseconds (µs)+/−400 ns after the end of the trigger frame as mandated by the IEEE 802.11ax standard. This SIFS time period could change in the future, so the precise amount of time is not critical, but is instructive to see that it is a very short time interval that is not expected to vary.

In these embodiments, to prevent inter-carrier interference (ICI) between the clients transmitting simultaneously, e.g., the previously mentioned in-band and out-of-band distortions, stations participating in the transmission also pre-compensate for carrier frequency offset (CFO). The client stations adjust their carrier frequency based on the trigger frame 210 received from the AP/BS device 116. The IEEE 802.11ax standard requires the residual CFO error after compensation to be less than 350 Hz. Again, the precise residual CFO error level required by the standard could change (likely become more stringent), and is included here only as exemplary of how stringent the requirement currently is in the IEEE 802.11ax standard.

Figure 3:
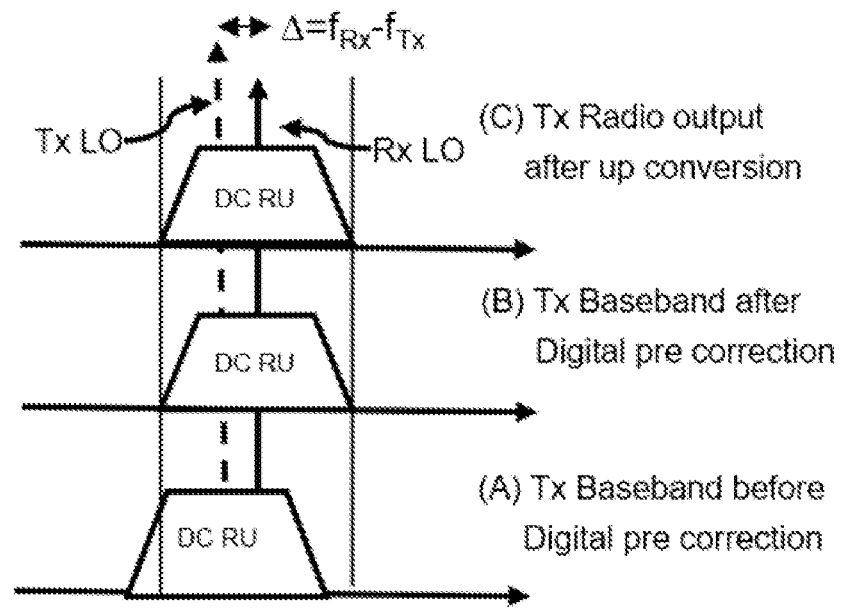
FIG. 3 is a set of carrier frequency plots illustrating functioning of digital precorrection according to at least one embodiment.

FIG. 3 is a set of carrier frequency plots illustrating functioning of digital precorrection according to at least one embodiment. As wireless technology has moved into higher frequencies, shorter antennas are employed in addition to up-conversion architecture to be able to transmit at those higher frequencies. To do so, radios in wireless devices modulate a baseband frequency into a carrier frequency, e.g., via a circuit in which the baseband signal is multiplied by the local oscillator (LO) frequency. But, if the LO is not ideal, carrier leakage may occur as a modulated signal is demodulated at the Rx LO of an AP/BS device 116.

Certain modern wireless devices take care of carrier frequency offset and carrier leakage using digital correction techniques. Using digital techniques for carrier frequency correction causes carrier leakage at the transmitter to be at an offset with respect to the AP's (or BS's) carrier frequency, which will be referred to as the receiver (Rx) LO center frequency. To represent this pictorially, in FIG. 3, the bottom image (A) illustrates the Tx baseband spectrum of the DC RU is aligned with the Tx LO before digital precorrection. In embodiments, the Tx LO is located within the radio of the wireless device 120, which is exemplary of any of the wireless devices 118-132, but selected as the focus of the description hereinbelow for clarity and ease of explanation. The middle image (B) illustrates the DC RU is aligned with the Rx LO after baseband correction. Finally, the top image (C) illustrates the Tx radio output, showing that the Tx LO leakage is not aligned with the Rx LO center frequency.

In embodiments, this lack of alignment between the Tx LO and the Rx LO within the DC RU (e.g., a delta of $f_{Rx}-f_{Tx}$) causes carrier leakage of the Tx LO frequency within the AP/BS device 116 at the Tx LO frequency. This carrier leakage leads to degraded EVM (in-band distortion) for RU spanning the DC carrier and degraded UTE (out-of-band distortion) for RU close to DC. Hence, digital precorrection puts a stringent requirement on the amount of residual carrier leakage to be able to meet EVM and UTE requirements.

Figure 4:
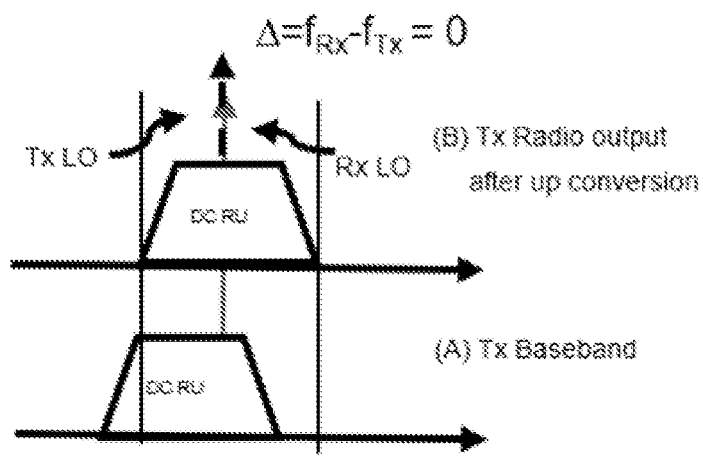
FIG. 4 is a set of carrier frequency plots illustrating transmission (Tx) local oscillator trimming pre-correction according to at least one embodiment.

FIG. 4 is a set of carrier frequency plots illustrating transmission (Tx) local oscillator trimming pre-correction according to at least one embodiment. To resolve the deficiencies in the digital pre-correction approach, FIG. 4 illustrates the results of instead performing a trim of the Tx LO frequency (e.g., the transmission carrier frequency) to compensate for the CFO. In embodiments, this is performed by directly updating the LO frequency of the radio frequency (RF) circuitry of the wireless device 120 (e.g., any of the wireless devices 118-132) based on estimated offset from a preceding trigger frame. This relaxes the requirements on residual carrier leakage to be able to meet UTE (among other) standard-based requirements.

For example, in disclosed embodiments, control logic of the wireless device 120 determines, from a received trigger frame 210, a carrier frequency offset (CFO) between a first carrier frequency of the Tx LO and a second carrier frequency of the Rx LO of the AP/BS device 116 operating in a multi-user transmission mode. In these embodiments, the control logic further triggers, based on the CFO, an LO trim of the Tx LO to adjust the first carrier frequency to match, within a threshold tolerance, the second carrier frequency. This threshold tolerance may be a low frequency stipulated by the relevant IEEE standard, for example, which was mentioned in one example is within 350 Hz, although a residual CFO of less or more than 350 Hz is envisioned, such as 450 Hz, 400 Hz, 300 Hz, 350 Hz, 250 Hz, or the like. In various embodiments, this direct LO trim technique may rely on the RF circuitry of the wireless device radio having control on LO frequency in granularity of a few Hz, a radio PLL to have a lock-in range up to a few hundreds of kilohertz (kHz) (e.g., the RF PLL locks automatically to a target frequency), and settling time for the LO to the trimmed frequency to be within the SIFS time period. Thus, in some embodiments, the control logic of the wireless device 120 is configured to adjust the carrier frequency of the Tx LO to within a few hertz of a target frequency associated with the Rx carrier frequency (e.g., of the AP/BS device 116).

Figure 5:
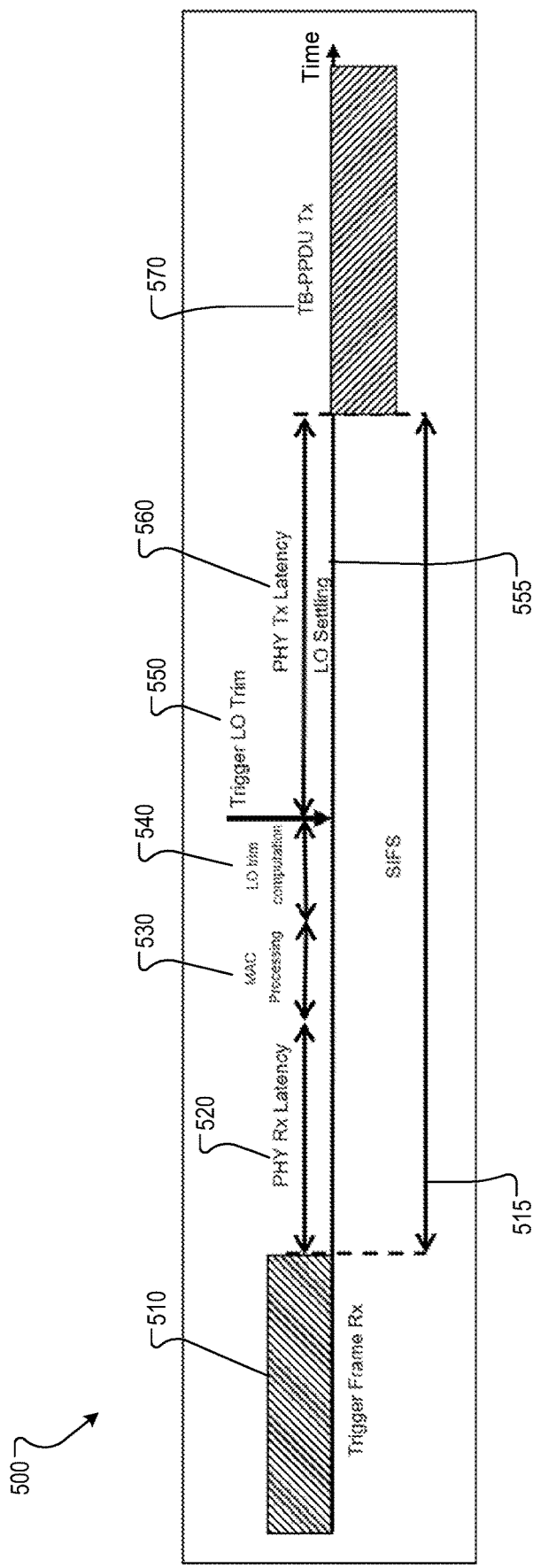
FIG. 5 is a timing diagram illustrating how trigger-based LO trim pre-correction can be implemented within a short interface space (SIFS) time period according to at least some embodiments.

FIG. 5 is a timing diagram 500 illustrating how trigger-based LO trim pre-correction can be implemented within a short interface space (SIFS) time period 515 according to at least some embodiments. Understanding that time moves from left to right in the timing diagram 500, a radio for the wireless device 120 receives (Rx) a trigger frame 510, from which control logic of the wireless device 120 can determine the CFO, e.g., the carrier frequency offset between the Tx LO of the wireless device 120 and the Rx LO of the AP/BS device 116 (e.g., $f_{Tx}-f_{Rx}$). In various embodiments, after the radio receives trigger frame 510, the radio undergoes physical layer (PHY) Rx latency 520 for processing the trigger frame 510 through the physical layer followed by medium access control (MAC) processing delay 530 before performing the LO trim computation 540. At the end of the PHY Rx latency 520, the CFO estimates become available to the control logic of the wireless device 120. Thus, in these embodiments, the trigger frame reception and content validation at MAC level is performed at during PHY Rx latency 520 and MAC processing delay 530 periods.

In these embodiments, during the MAC processing delay 530, the control logic of the wireless device 120 calculates the LO trim value as a signal to the Tx LO (or RF PLL that includes the Tx LO) in order to compensate for (e.g., substantially remove) the CFO, which will be discussed in more detail with reference to subsequent Figures. At a particular time 550, e.g., after determining the LO trim 540, after the MAC processing delay 530 period, the control logic can trigger a trim of the Tx LO, e.g., in sufficient time that the Tx LO settles (e.g., during an LO settling period 555) before an end of the SIFS time period 515. Thus, a PHY Tx latency 560 before being able to transmit (Tx) the TB-PPDU frame 570 can be used to calculate approximately the latest possible moment to schedule the particular time 550 at which to trigger the LO trim of the Tx LO. In this way, the trim of the Tx LO has time to settle and causes a shift in the Tx carrier frequency of the wireless device 120 in advance of the radio transmitting a protocol data unit frame (e.g., the TB-PDDU frame 570) using the trimmed Tx LO.

Figure 6:
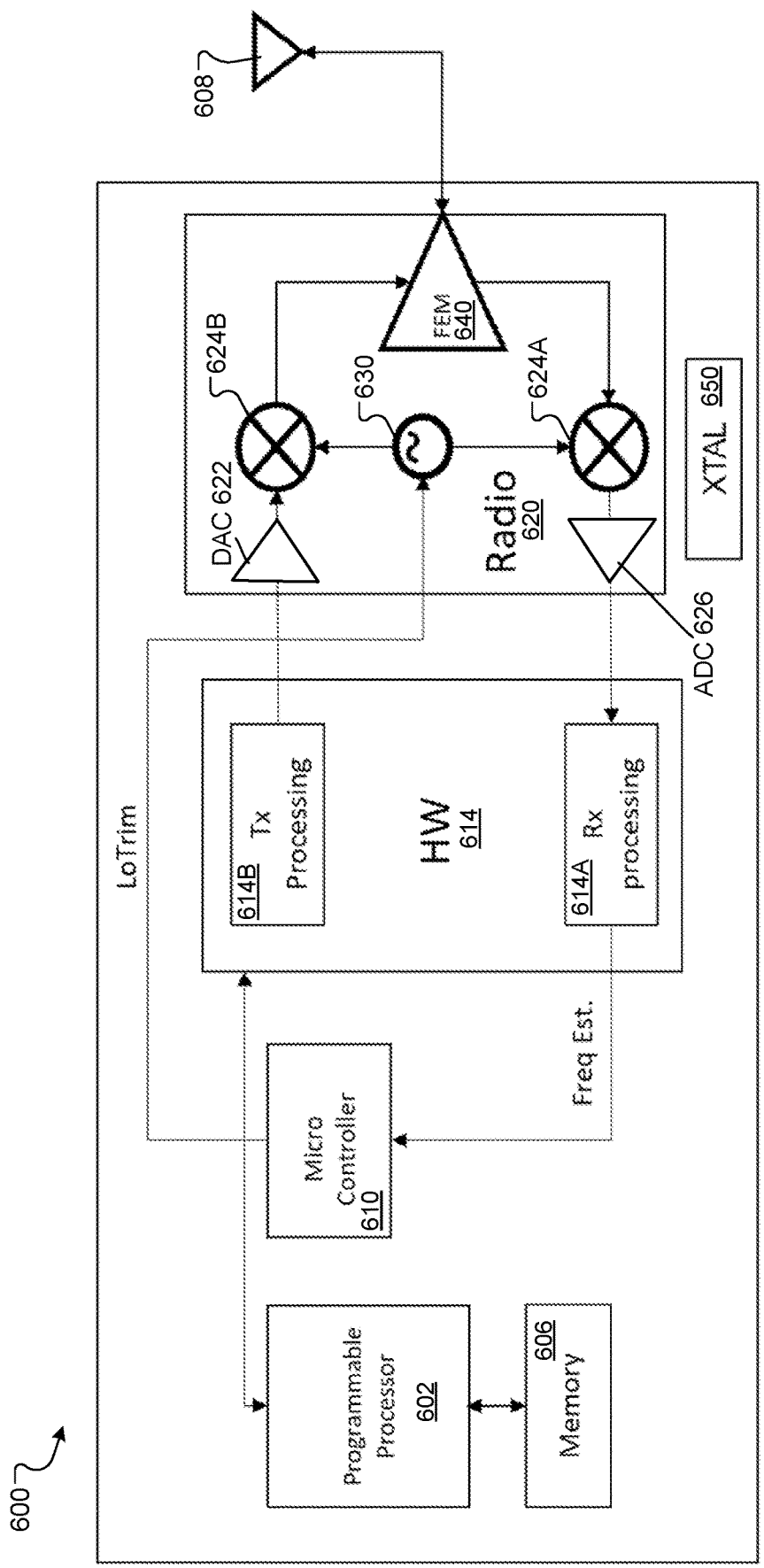
FIG. 6 is a block diagram of a wireless device having a microcontroller to perform computations using frequency estimation from physical layer (PHY) hardware and trigger LO trim pre-correction according to some embodiments.

FIG. 6 is a block diagram of a wireless device 600 having a microcontroller to perform computations using frequency estimations from PHY hardware and trigger LO trim pre-correction according to some embodiments. In embodiments, the wireless device 600 is any of the wireless devices 118-132. In some embodiments, the wireless device 600 includes a programmable processor 602, a memory 606 (e.g., non-volatile and/or volatile memory), an antenna 608, a microcontroller 610 (e.g., control logic), hardware 614 including Rx processing hardware 614A and Tx processing hardware 614B, a radio 620 that includes RF circuitry, and an external oscillator 650 (e.g., an external crystal, or XTAL). In various embodiments, the radio 620 includes a digital-to-analog converter (DAC) 622, a demodulator 624A, an analog-to-digital converter (ADC) 626, a modulator 624B, a local oscillator (LO) 630 (also referred to herein as the Tx LO), and a frontend (hereinafter FEM 640) having one or more front end modules operatively coupled to the antenna 608. In embodiments, the microcontroller 610 is embodied in digital logic, or programmed hardware, and executes microcode such as firmware.

In these embodiments, the programmable processor 602 executes instructions (e.g., computer code and/or firmware) to drive and provide parameters for functionality of the hardware 614. In embodiments, the hardware 614 is coupled to the radio 620 and the microcontroller 610 is coupled between the Rx processing hardware 614A and the LO 630 of the radio 620. In some embodiments, the LO 630 is implemented within an RF PLL of the RF circuitry, for example. In some embodiments, the LO 630 is integrated with the RF circuitry of the radio 620 and is either a resistive-capacitive (or R-C) oscillator or a real time clock (RTC) oscillator. In some embodiments, the LO trim triggers selection or de-selection of capacitors in a capacitor bank and/or resistors in a resistor bank in order to tune the Tx LO carrier frequency.

In disclosed embodiments, an incoming signal (e.g., containing the trigger frame 210) is captured by the antenna 608 and the FEM 640 and passed to the demodulator 624A (e.g., a demodulator) to demodulate the received signal, which is passed through the ADC 626 to the RX processing 614A. In embodiments, this demodulation extracts the original information-bearing signal that includes the trigger frame 210. The Rx processing hardware 614A may then process the demodulated signal to obtain, among other information, an estimate of the CFO from the trigger frame 210. In embodiments, the Rx processing hardware 614A provides the CFO information to the microcontroller 610. In these embodiments, the microcontroller 610 is programmed to process the estimated CFO to generate an LO trim value that will cause the LO 630 (or RF PLL that includes the LO 630) to shift in carrier frequency that compensates for the estimated CFO.

Thus, in embodiments, the transmission side of the wireless device 600 generates a transmission at a trimmed LO carrier frequency. For example, the Tx processing hardware 614B processes information for the upcoming transmission signal, which is turned into an analog signal by the DAC. In these embodiments, the modulator 624B modulates the analog signal and provides the modulated analog signal to the FEM 640 for transmission. In some embodiments, the modulator 624B uses a frequency trimmed off the LO 630, and thus the TB-PDDU frame that is transmitted out of the FEM 640 and antenna 608 is based on the shifted carrier frequency of the trimmed LO 630 (e.g., trimmed Tx LO). In this way, the carrier leakage (which causes in-band and out-of-band distortions) is better dealt with by pre-correcting the Tx LO (the LO 620) of the wireless device 600 to compensate for the CFO between the Rx LO (of the AP/BS device 116) and Tx LO.

Further, in some embodiments, the radio 620 comprises a radio frequency (RF) phase-locked loop (PLL) that includes the first LO. In these embodiments, the control logic (e.g., the microcontroller 610 I this embodiment) is configured to calculate an updated RF PLL frequency based on the CFO, trigger the RF PLL to operate at the updated RF PLL frequency in response to the LO trim, and after transmission of the protocol data unit frame, cause the RF PLL to operate at a default RF PLL frequency.

Figure 7:
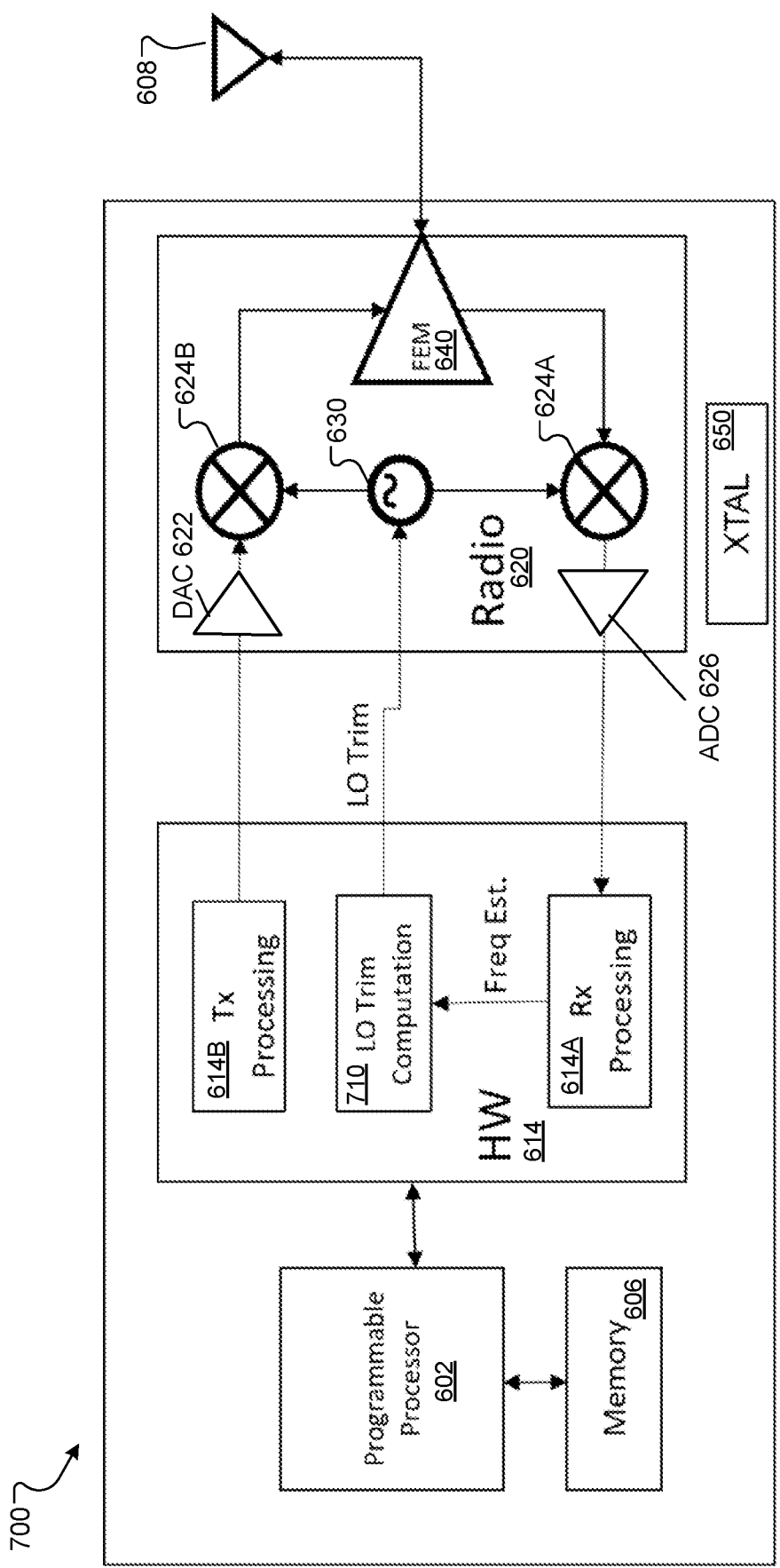
FIG. 7 is a block diagram of a wireless device employing hardware to perform frequency estimation and trigger LO trim pre-correction according to some embodiments.

FIG. 7 is a block diagram of a wireless device 700 employing hardware to perform frequency estimation and trigger LO trim pre-correction according to some embodiments. In some embodiments, the wireless device 600 of FIG. 6 is modified so that instead of the microcontroller 610, LO trim computation hardware 710 (which can be discrete hardware components, programmed hardware components, or a combination thereof) is included within the hardware 614 provided on the wireless device 700. In this embodiment, the LO trim computation hardware 710 calculates the LO trim value based on the estimated CFO received from the Rx processing hardware 614A. In this embodiment, therefore, the LO trim computation hardware 710 provides the LO trim value to the LO 630 (or an RF PLL that includes the LO 630) to provide the shift in Tx LO carrier frequency to compensate for the estimated CFO.

Figure 8:
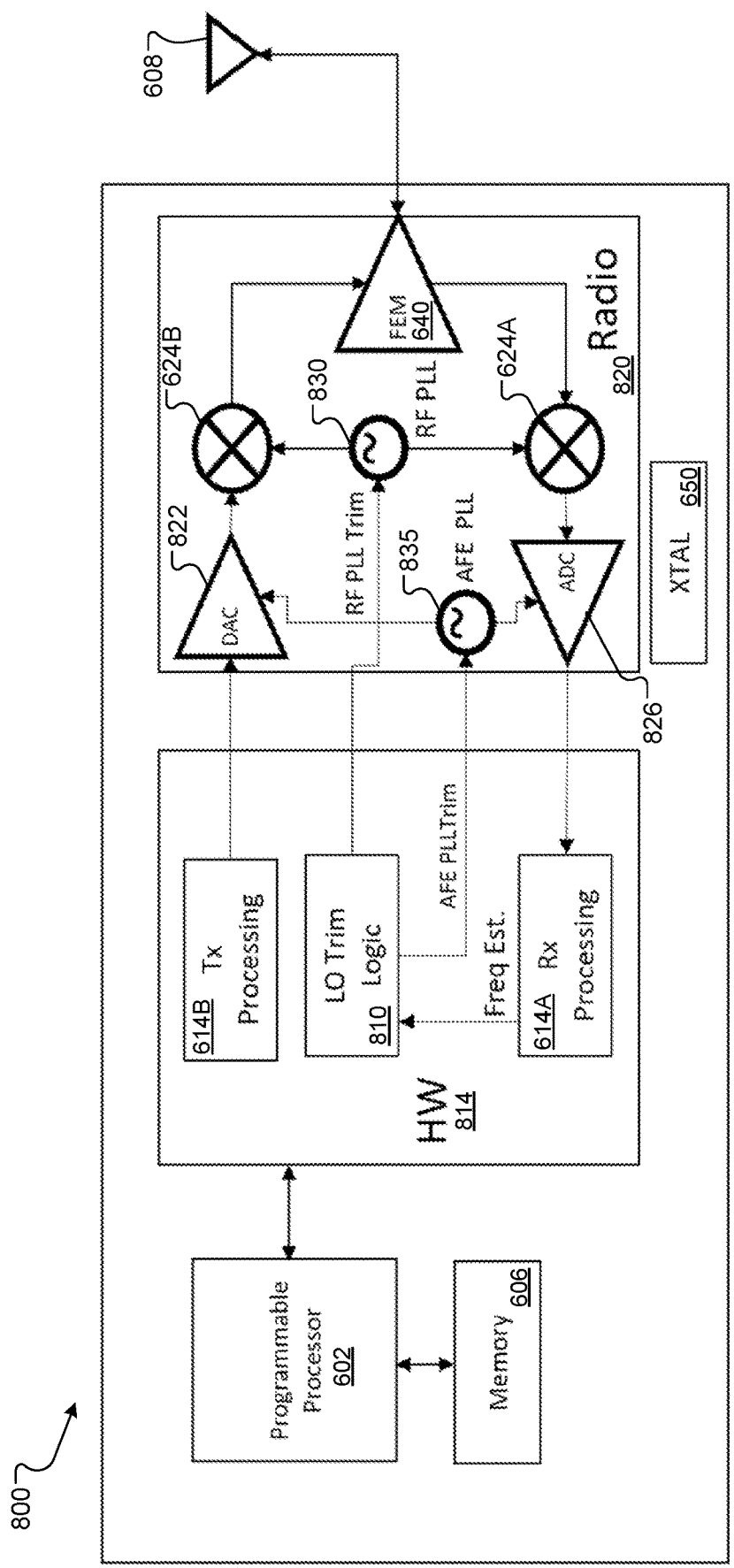
FIG. 8 is a block diagram of a wireless device employing hardware to perform both LO trim pre-correction and analog front end (AFE) phase-locked loop (PLL) trimming according to some embodiments.

FIG. 8 is a block diagram of a wireless device 800 employing hardware to perform both LO trim pre-correction and analog front end (AFE) phase-locked loop (PLL) trimming according to some embodiments. In embodiments, the wireless device 800 of FIG. 8 expands on the wireless device 700 of FIG. 7 in implementations where the device includes different PLLs for generating clocks for the AFE and the RF separately. For example, in the embodiment of FIG. 8, a radio 820 of the wireless device 800 includes a radio frequency (RF) phase-locked loop (PLL) or RF PLL 830 (e.g., which can include an LO like the LO 630 from FIGS. 6-7), an ADC 826 coupled to the demodulator 624A that is driven by the RF PLL 830, a DAC 822 coupled to the modulator 624B that is driven by the RF PLL 830, and an analog front end PLL 835 (or AFE PLL) configured to generate a clock to drive the ADC 826 and the DAC 822. In embodiments, the receive (Rx) processing hardware 614A is coupled to the ADC 826 and the trim logic 810. In embodiments, the transmit (Tx) processing hardware 614B is coupled to the DAC 822 and trim logic 810 is coupled to both the AFE PLL 835 and the RF PLL 830.

In these embodiments, hardware 814 of the wireless device 800 includes LO trim logic 810 coupled to the RF PLL 830 and the analog front end PLL 835, where the LO trim logic 810 provides a clocking mechanism in the radio 820 to a separate PLL for the AFE/DAC clocks from the RF PLL 830 that clocks the demodulator 624A and the modulator 624B. Thus, in these embodiments, the LO trim logic 810 is configured to trim both the analog front end PLL 835 and the RF PLL 830 separately to provide the ability for both carrier and sampling clock frequency tuning of the RF circuitry in the radio 820.

In various embodiments, therefore, the LO trim logic 810 is configured to determine, from a received trigger frame, a carrier frequency offset (CFO) between a first carrier frequency of the RF PLL and a second carrier frequency of a local oscillator (LO) of an access point (e.g., the AP/BS device 116) operating in a multi-user transmission mode. In these embodiments, the trim logic 810 further triggers, based on the CFO, a first trim of the RF PLL 830 to adjust the first carrier frequency to match, within a threshold tolerance, the second carrier frequency. In these embodiments, the LO trim logic 810 further triggers, based on the CFO, a second trim of the analog front end PLL 835 to ensure both carrier and sampling clocks are aligned and support meeting the threshold tolerance. Thus, the radio 820 may be configured to transmit, to the access point (e.g., the AP/BS device 116), a protocol data unit frame using the trimmed RF PLL. In some embodiments, the LO trim logic 810 is to continuously trigger the first trim of the RF PLL 830 and the second trim of the analog front end PLL 835 in response to detecting changes to the carrier frequency offset (CFO) during transmission of multiple protocol data unit frames to the access point.

Figure 9:
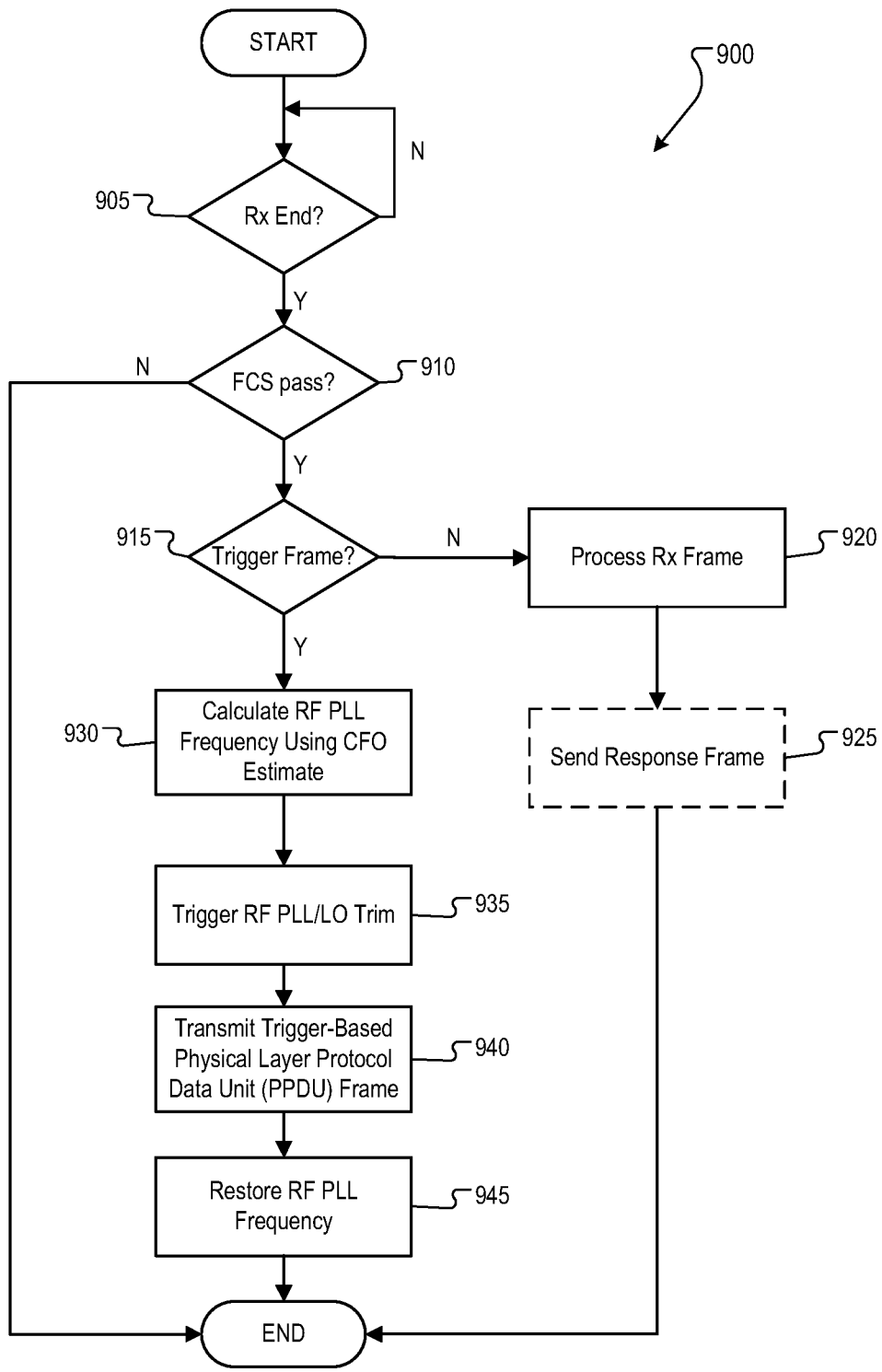
FIG. 9 is a flow diagram of a method of performing an LO pre-correction in a transmission device according to various embodiments.

FIG. 9 is a flow diagram of a method 900 of performing an LO pre-correction in a transmission device according to various embodiments. The method 900 can be performed by processing logic that can include hardware (e.g., processing device, circuitry, dedicated logic, programmable logic, microcode, hardware of a device, integrated circuit, etc.), a microcontroller (e.g., digital logic, programmed logic, firmware), or a combination thereof. In some embodiments, the method 900 is performed by control logic and/or hardware of one of the wireless devices 600, 700, and/or 800 (FIGS. 6-8). In some embodiments, the method 900 relates to Rx processing within this control logic and/or hardware that is performed before performing Tx processing of Tx frames.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 905, the processing logic determines whether receiving a frame in a modulated signal has ended and continues waiting until verifying that a modulated signal has been fully received. This frame may or may not be a trigger frame.

At operation 910, the processing logic determines whether a frame sequence check (FCS) has passed on the received modulated signal. An FCS may be understood as an error-detecting code added to a frame in a communication protocol. Frames are used to send payload data from a source to a destination. If the FCS has not passed, the method 900 ends; otherwise, when the FCS has passed, the method 900 flows to operation 915.

At operation 915, the processing logic determines whether a trigger frame has been received from the access point, e.g., the AP/BS device 116. For example, whether the frame received at operation 905 is detected as a trigger frame. If no trigger frame has been received, at operation 920, the processing logic processes an Rx frame, e.g., due to the received frame not being the trigger frame. At operation 925, the processing logic optionally sends a response frame (e.g., an ACK frame) to the AP/BS device 116.

At operation 930, in response to determining that a trigger frame has been received, the processing logic calculates an RF PLL frequency using the CFO estimate after trigger frame reception and content validation at a medium access control level, the latter of which was discussed in detail with reference to FIG. 5.

At operation 935, the processing logic triggers, based on the CFO estimate, a trim of the RF PLL (or Tx LO) to adjust the first carrier frequency of the transmission wireless device to match, within a threshold tolerance, the second carrier frequency of the AP/BS device 116. In some embodiments, just before operation 935 is performed, the processing logic stores a default PLL (or LO) frequency for the Tx LO so the default PLL (or LO) frequency can later be restored at operation 945. Further, the triggering the trim of the RF PLL (or Tx LO) may be performed in sufficient time that the Tx LO settles before an end of the SIFS time period 555.

At operation 940, the processing logic transmits, to the access point (e.g., the AP/BS device 116), a protocol data unit frame (e.g., the TB-PPDU) frame using the trimmed first LO. In embodiments, the protocol data unit frame is associated with the multi-user transmission mode.

At operation 945, the processing logic restores the RF PLL frequency, e.g., a default frequency or the frequency that was being used preceding the Tx LO trim, e.g., enabling operation in a default state of the RF circuitry before repeating the method 900 in response to receiving another trigger frame at operation 915, for example.

Figure 10:
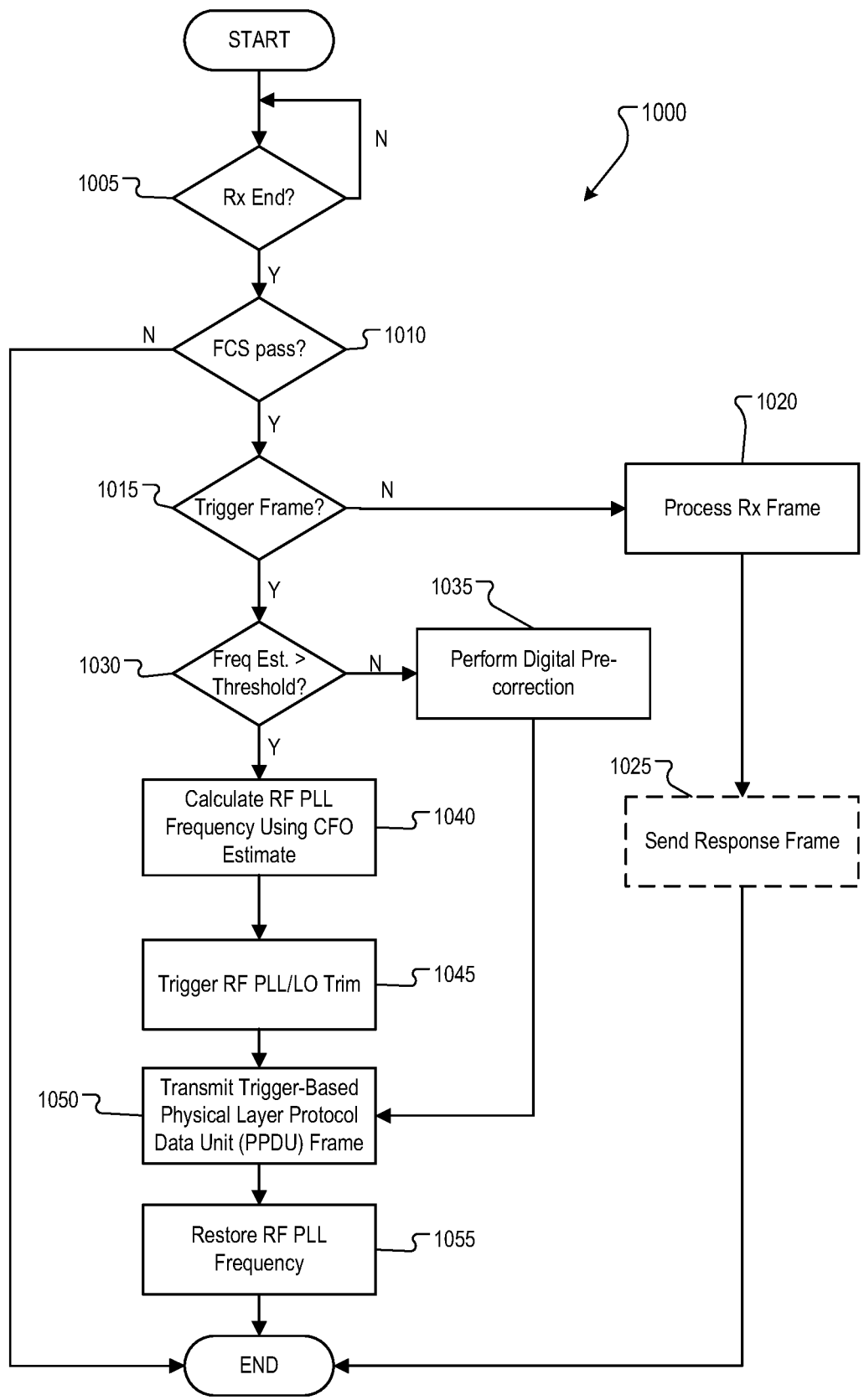
FIG. 10 is a flow diagram of a method of performing either LO trim pre-correction or digital pre-correction based on a frequency estimation from a trigger frame according to some embodiments.

FIG. 10 is a flow diagram of a method 1000 of performing either LO trim pre-correction or digital pre-correction based on a frequency estimation from a trigger frame according to some embodiments. The method 1000 can be performed by processing logic that can include hardware (e.g., processing device, circuitry, dedicated logic, programmable logic, microcode, hardware of a device, integrated circuit, etc.), a microcontroller (e.g., digital logic, programmed logic, firmware), or a combination thereof. In some embodiments, the method 1000 is performed by control logic and/or hardware of one of the wireless devices 600, 700, and/or 800 (FIGS. 6-8). In some embodiments, the method 1000 relates to Rx processing within this control logic and/or hardware that is performed before performing Tx processing of Tx frames. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1005, the processing logic determines whether receiving a frame in a modulated signal has ended and continues waiting until verifying that a modulated signal has been fully received. This frame may or may not be a trigger frame.

At operation 1010, the processing logic determines whether a frame sequence check (FCS) as passed on the received modulated signal. An FCS may be understood as an error-detecting code added to a frame in a communication protocol. Frames are used to send payload data from a source to a destination. If the FCS has not passed, the method 1000 ends; otherwise, when the FCS has passed, the method 1000 flows to operation 1015.

At operation 1015, the processing logic determines whether a trigger frame has been received from the access point, e.g., the AP/BS device 116. If no trigger frame has been received, at operation 1020, the processing logic process an Rx frame, e.g., due to the receive frame not being the trigger frame. At operation 1025, the processing logic optionally sends a response frame (e.g., an ACK frame) to the AP/BS device 116.

At operation 1030, the processing logic determines whether the CFO estimate is greater than a threshold value. In response to the CFO not being greater than the threshold value, at operation 1035, the processing logic employs digital pre-correction to generation of the protocol data unit frame (which occurs at operation 1050). In response to the trigger frame being received (operation 1015) and the CFO being greater than the threshold value (operation 1030), the method 1000 moves to operation 1040.

At operation 1040, the processing logic calculates an RF PLL frequency using the CFO estimate after trigger frame reception and content validation at a medium access control level, the latter of which was discussed in detail with reference to FIG. 5.

At operation 1045, the processing logic triggers, based on the CFO estimate, a trim of the RF PLL (or Tx LO) to adjust the first carrier frequency of the transmission wireless device to match, within a threshold tolerance, the second carrier frequency of the AP/BS device 116. In some embodiments, just before operation 1045 is performed, the processing logic stores a default phase-locked loop (PLL) frequency (or default LO frequency) for the Tx LO so the default PLL (or default LO) frequency can later be restored at operation 1055. Further, the triggering the trim of the RF PLL (or Tx LO) may be performed in sufficient time that the Tx LO settles before an end of the SIFS time period 555.

At operation 1050, the processing logic transmits, to the access point (e.g., the AP/BS device 116), a protocol data unit frame (e.g., the TB-PPDU) frame using either digital pre-correction or the trimmed first LO. In embodiments, the protocol data unit frame is associated with the multi-user transmission mode.

At operation 1055, the processing logic restores the RF PLL frequency, e.g., a default frequency or the frequency that was being used preceding the Tx LO trim, e.g., enabling operation in a default state of the RF circuitry before repeating the method 1000 in response to receiving another trigger frame at operation 1015, for example.

Figure 11:
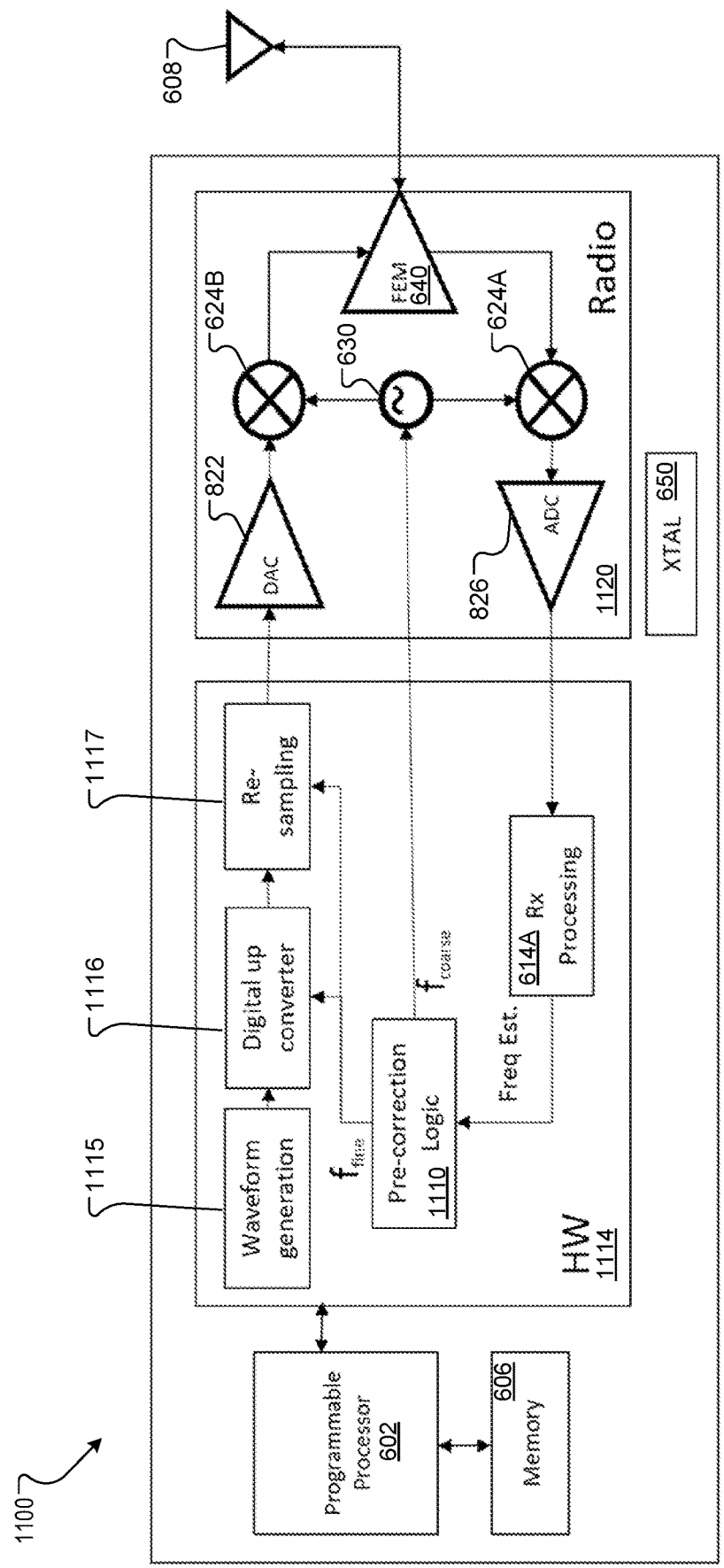
FIG. 11 is a block diagram of a wireless device that performs LO trim pre-correction for coarse carrier frequency correction and digital pre-correction for fine carrier frequency correction according to various embodiments.

FIG. 11 is a block diagram of a wireless device 1100 that performs LO trim pre-correction for coarse carrier frequency correction and digital pre-correction for fine carrier frequency correction according to various embodiments. In an extension to the embodiments of FIG. 8, the wireless device 1100 employs a pre-correction to CFO that is performed both through an LO trim for a coarse correction and in digital for a fine correction, enabling a wider range of potential frequency modifications to at least meet the stringent standard levels for EVM, UTE, and CFO. For example, this coarse/fine pre-correction approach may be implemented where the radio PLL accuracy is not sufficient to meet specification of the standard requirements.

With reference to FIG. 11, the wireless device 1100 includes hardware 1114 that includes pre-correction logic 1110 coupled between the Rx processing hardware 614A, the LO 630 (or RF PLL), and digital pre-correction components, which are also included in the hardware 1114. In at least some embodiments, the pre-correction logic 1110 is configured to determine that the LO trim (calculated as per FIGS. 8-10) is insufficient to satisfy a target residual frequency offset value when transmitting to the AP/BS device 116. In embodiments, the pre-correction logic 1110 calculates a digital pre-correction offset required to satisfy the target residual frequency offset value and causes digital up-conversion, using the digital pre-correction offset, of a waveform driving digital processing of the protocol data unit frame.

More specifically, in at least some embodiments, the digital pre-correction components include a waveform generator 1115 to generate an digital frame (e.g. TB-PPDU), a digital up-converter 1116, and a digital re-sampler 1117 that are coupled together in a string, the latter of which is coupled to the DAC 822. In these embodiments, the pre-correction logic 1110 is configured to determine, based on a CFO estimate, a coarse LO trim value ($f_{coarse}$), which the pre-correction logic 1110 uses to adjust (trim) the LO 630 or RF PLL. Because that coarse trim may not be sufficient to meet the stringent requirement related to carrier leakage of the IEEE standard, the pre-correction logic 1110 may be configured to determine a set of digital parameters with which to update the digital up-conversion of the digital up-converter 1116 and/or resampling of the digital re-sampler 1117. In this way, the pre-correction logic 1110 may trigger the digital pre-correction components in a further, fine digital pre-correction that impacts the signal sent through the DAC 822 for incorporation into the protocol data unit frame transmitted by a radio 1120.

Figure 12:
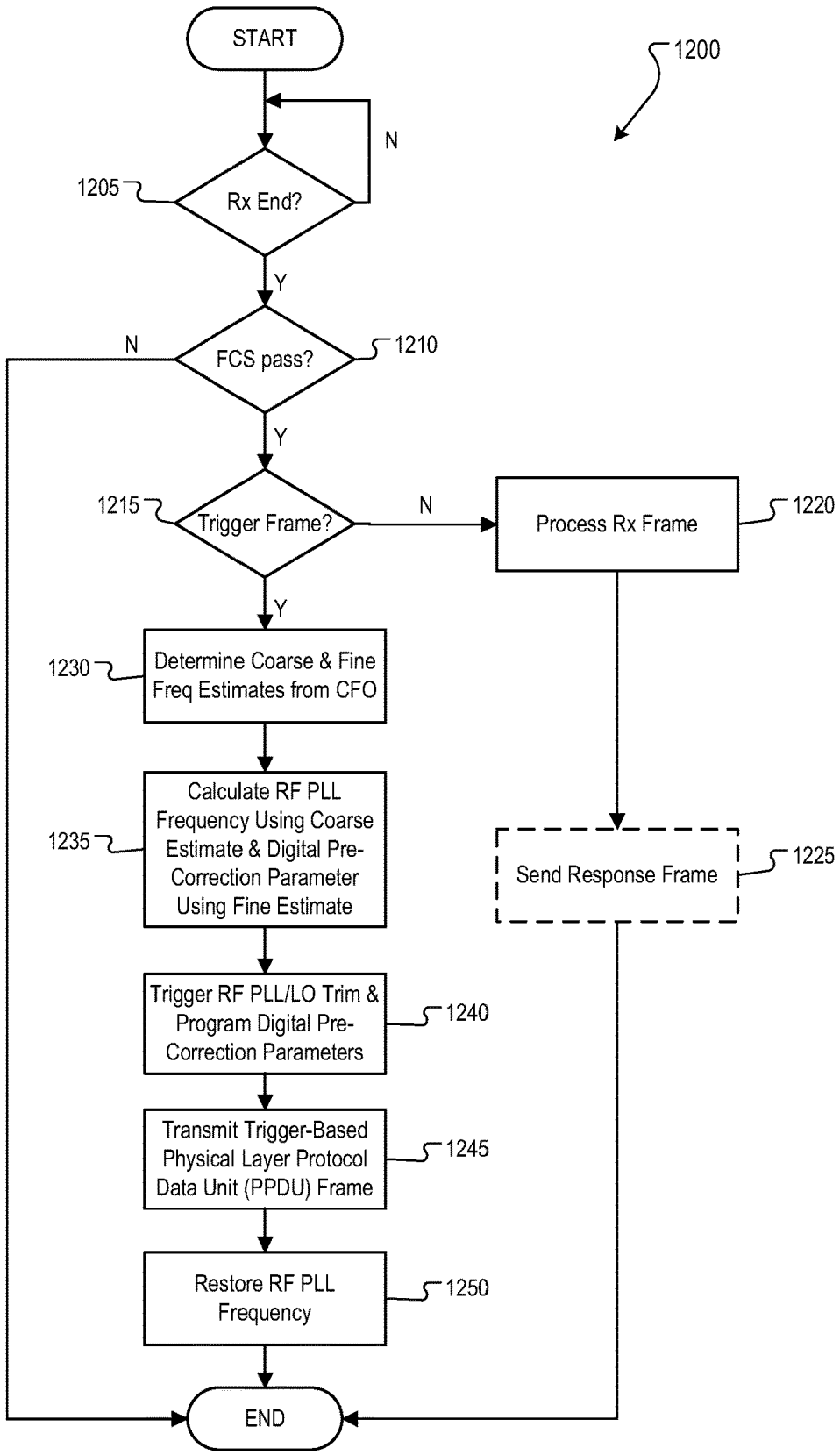
FIG. 12 is a flow diagram of a method of performing LO trim pre-correction for coarse carrier frequency correction and digital pre-correction for fine carrier frequency correction according to various embodiments.

FIG. 12 is a flow diagram of a method 1200 of performing LO trim pre-correction for coarse carrier frequency correction and digital pre-correction for fine carrier frequency correction according to various embodiments. The method 1200 can be performed by processing logic that can include hardware (e.g., processing device, circuitry, dedicated logic, programmable logic, microcode, hardware of a device, integrated circuit, etc.), a microcontroller (e.g., digital logic, programmed logic, firmware), or a combination thereof. In some embodiments, the method 1200 is performed by control logic and/or hardware, e.g., the pre-correction logic 1110 of FIG. 11. In some embodiments, the method 1200 relates to Rx processing within this control logic and/or hardware that is performed before performing Tx processing of Tx frames. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1205, the processing logic determines whether receiving a frame in a modulated signal has ended and continues waiting until verifying that a modulated signal has been full received. This frame may or may not be a trigger frame.

At operation 1210, the processing logic determines whether a frame sequence check (FCS) as passed on the received modulated signal. An FCS may be understood as an error-detecting code added to a frame in a communication protocol. Frames are used to send payload data from a source to a destination. If the FCS has not passed, the method 1200 ends; otherwise, when the FCS has passed, the method 1200 flows to operation 1215.

At operation 1215, the processing logic determines whether a trigger frame has been received from the access point, e.g., the AP/BS device 116. If no trigger frame has been received, at operation 1220, the processing logic process an Rx frame, e.g., due to the receive frame not being the trigger frame. At operation 1225, the processing logic optionally sends a response frame (e.g., an ACK frame) to the AP/BS device 116.

At operation 1230, in response to determining that a trigger frame has been received, the processing logic estimates a coarse frequency to compensate for the CFO estimate and estimates a fine frequency to further compensate for the CFO estimate.

At operation 1235, the processing logic calculates an RF PLL frequency using the coarse frequency estimate and digital pre-correction parameters using the fine frequency estimate after trigger frame reception and content validation at a medium access control level, the latter of which was discussed in detail with reference to FIG. 5.

At operation 1240, the processing logic triggers, based on the coarse frequency estimate, a trim of the RF PLL (or Tx LO) to adjust the first carrier frequency of the transmission wireless device to match, within a first threshold tolerance, the second carrier frequency of the AP/BS device 116. Also, at operation 1240, the processing logic programs, into the digital pre-correction components, the digital pre-correction parameters to fine tune digitally the transmitted frame frequency associated with the fine frequency estimate. In some embodiments, just before operation 1240 is performed, the processing logic stores a default PLL (or LO) frequency for the Tx LO so the default PLL (or LO) frequency can later be restored at operation 1250. Further, the triggering the trim of the RF PLL (or Tx LO) may be performed in sufficient time that the Tx LO settles before an end of the SIFS time period 555.

At operation 1245, the processing logic transmits, to the access point (e.g., the AP/BS device 116), a protocol data unit frame (e.g., the TB-PPDU) frame using the trimmed first LO using a coarse estimate and digital pre-correction using a fine estimate. In embodiments, the protocol data unit frame is associated with the multi-user transmission mode.

At operation 1250, the processing logic restores the RF PLL frequency, e.g., a default frequency or the frequency that was being used preceding the Tx LO trim and digital pre-correction, e.g., enabling operation in a default state of the RF circuitry before repeating the method 1200 in response to receiving another trigger frame at operation 1215, for example.

Figure 13:
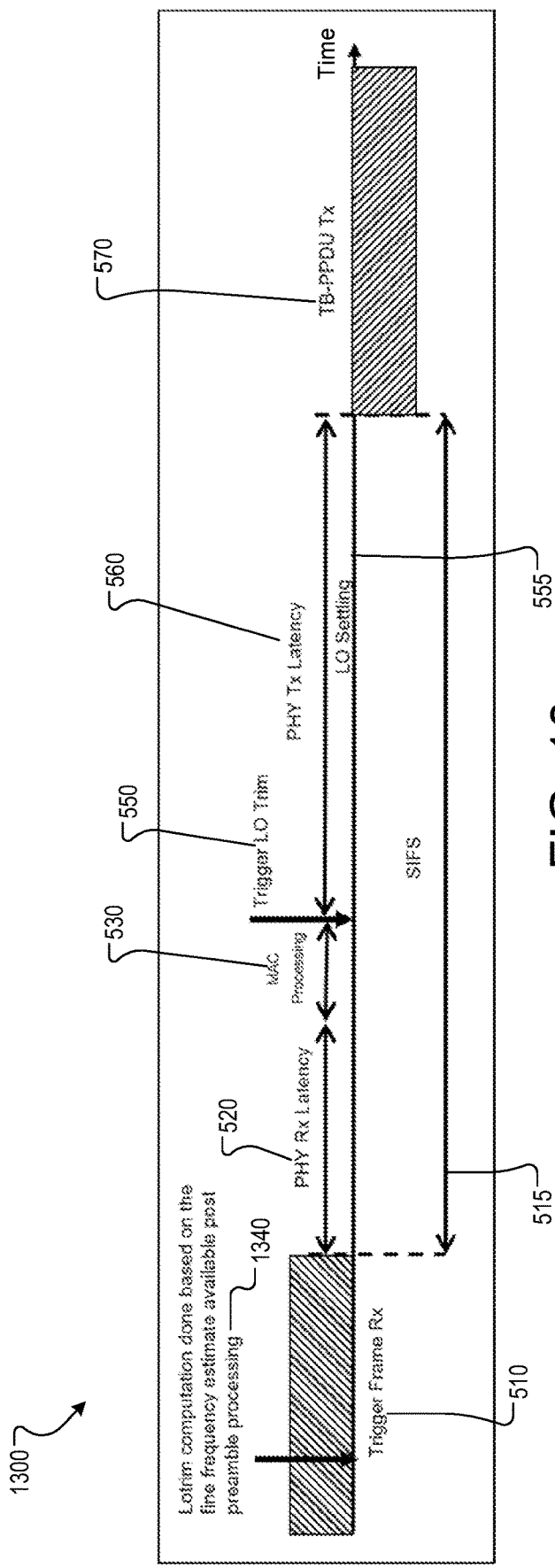
FIG. 13 is a timing diagram illustrating how trigger-based LO trim pre-correction can be implemented within the SIFS time period, but where the LO trim-based frequency calculation is performed post preamble processing, according to at least some embodiments.

FIG. 13 is a timing diagram 1300 illustrating how trigger-based LO trim pre-correction can be implemented within the SIFS time, but where the LO trim-based frequency calculation is performed post preamble processing, according to at least some embodiments. As a modification to the diagram 500 of FIG. 5, computing the LO trim value much earlier in time while receiving (Rx) the trigger frame 210 helps to improve the timing of pre-correction for the CFO estimate, e.g., allows more settling time for the LO after triggering the LO trim computation 540. Thus, in the embodiment of FIG. 13, the control logic of a wireless device at time 1340 determines the LO trim value based on a fine frequency estimate of the CFO that is available post preamble processing of the trigger frame. As illustrated, because the LO trim value is computed earlier, the LO trim computation 540 is removed from the LO settling period 555, enabling pushing the trigger LO trim 550 to an earlier point in time during the SIFS time period 515.

Figure 14:
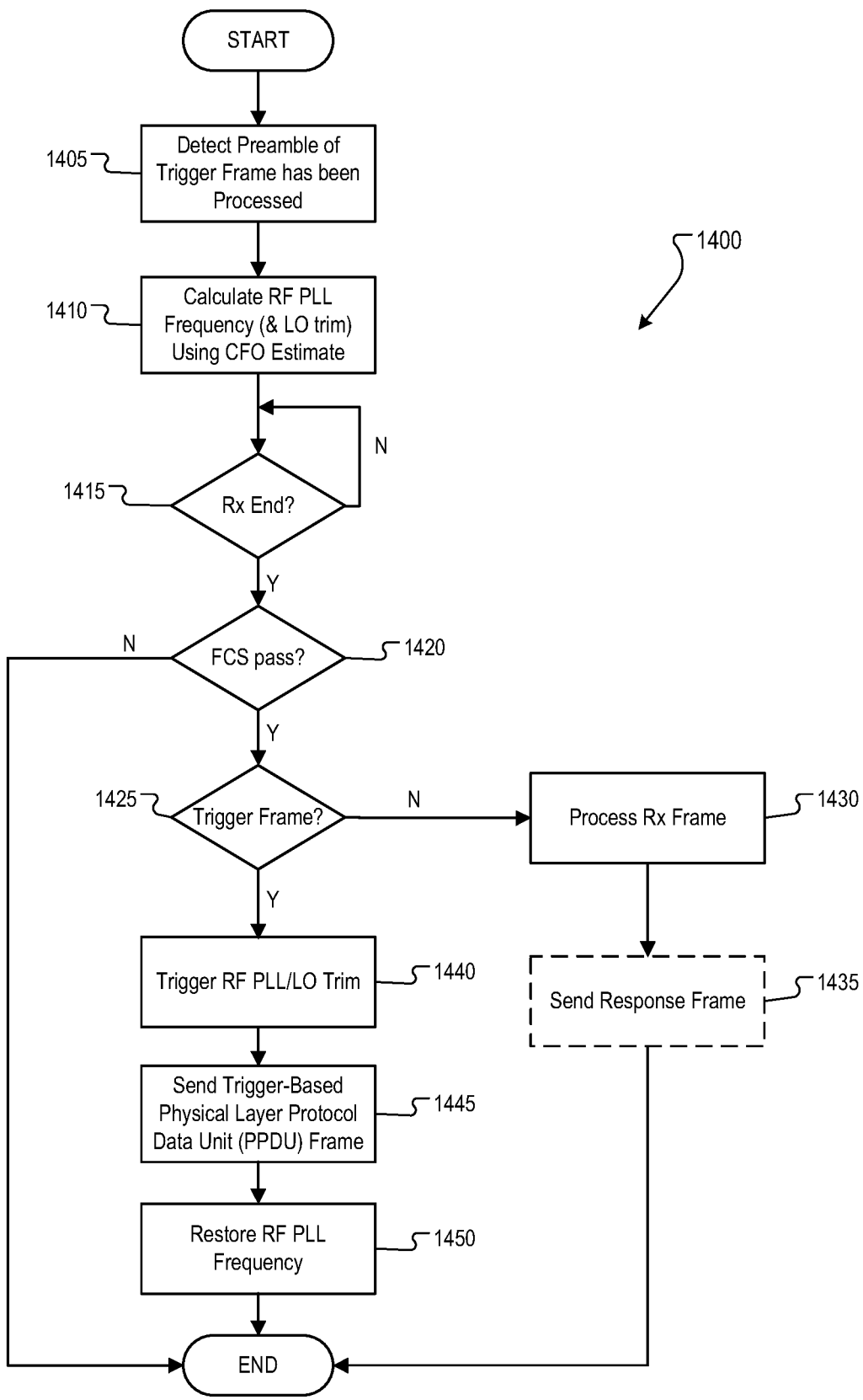
FIG. 14 is a flow diagram of an example method for performing LO trim pre-correction within the SIFS time period where the LO trim-based frequency calculation is performed post preamble processing, according to some at least some embodiments.

FIG. 14 is a flow diagram of an example method 1400 for performing LO trim pre-correction within the SIFS time where the LO trim-based frequency calculation is performed post preamble processing, according to some at least some embodiments. The method 1400 can be performed by processing logic that can include hardware (e.g., processing device, circuitry, dedicated logic, programmable logic, microcode, hardware of a device, integrated circuit, etc.), a microcontroller (e.g., digital logic, programmed logic, firmware), or a combination thereof. In some embodiments, the method 1400 is performed by control logic and/or hardware of one of the wireless devices 600, 700, and/or 800 (FIGS. 6-8). In some embodiments, the method 1400 relates to Rx processing within this control logic and/or hardware that is performed before performing Tx processing of Tx frames. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1405, the processing logic detects that a preamble of a frame received from an access point (e.g., the AP/BS device 116) has been processed, the access point operating in a multi-user transmission mode. Operation 1405 may be performed for each frame received from the access point in order to detect CFO-related information as early on as possible, but if later it's determine to not be a trigger frame, the method 1400 can restart, for example.

At operation 1410, the processing logic estimates, based on information derived from the trigger frame after preamble processing, a carrier frequency offset (CFO) between a first carrier frequency of the first LO and a second carrier frequency of a second LO of the access point. Also at operation 1410, the processing logic calculates (or otherwise determines) an LO (or RF PLL) trim value using the CFO estimate. In some embodiments, determining the LO trim value includes estimating a shift in the first carrier frequency required so that the first carrier frequency matches the second carrier frequency within a threshold tolerance.

At operation 1415, the processing logic determines whether receiving the trigger frame in a modulated signal has ended and continues waiting until verifying that a modulated signal has been fully received.

At operation 1420, the processing logic determines whether a frame sequence check (FCS) as passed on the received modulated signal. An FCS may be understood as an error-detecting code added to a frame in a communication protocol. Frames are used to send payload data from a source to a destination. If the FCS has not passed, the method 1400 ends; otherwise, when the FCS has passed, the method 1400 flows to operation 1425.

At operation 1425, the processing logic determines whether a trigger frame has been received from the access point, e.g., the AP/BS device 116. For example whether the frame processed with reference to operation 1405 was indeed a trigger frame. If no trigger frame has been received, at operation 1430, the processing logic processes an Rx frame, e.g., due to the received frame not being the trigger frame. At operation 1435, the processing logic optionally sends a response frame (e.g., an ACK frame) to the AP/BS device 116.

At operation 1440, the processing logic triggers, using the LO trim value, a trim of the RF PLL (or Tx LO) to adjust the first carrier frequency of the transmission wireless device to match, within a threshold tolerance, the second carrier frequency of the AP/BS device 116.

At operation 1445, the processing logic transmits, to the access point (e.g., the AP/BS device 116), a protocol data unit frame (e.g., the TB-PPDU) frame using the trimmed first LO. In embodiments, the protocol data unit frame is associated with the multi-user transmission mode.

At operation 1450, the processing logic restores the RF PLL frequency, e.g., a default frequency or the frequency that was being used preceding the Tx LO trim, e.g., enabling operation in a default state of the RF circuitry before repeating the method 1400 in response to receiving another trigger frame, for example. For example, the method 1400 can further include continuously adjusting the LO trim value of the first LO on a per-frame basis in response to detecting changes to the CFO during transmission of multiple uplink protocol data unit frames to one or more access points.

It will be apparent to one skilled in the art that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C/PD mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the disclosure has been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A wireless device comprising:
   a radio comprising a front end and a first local oscillator (LO); and
   control logic coupled to the radio, the control logic to:
   determine, from a received trigger frame directed at a plurality of wireless devices, a carrier frequency offset (CFO) between a first carrier frequency of the first LO and a second carrier frequency of a second LO of an access point operating in a multi-user transmission mode; and
   trigger, based on the CFO, an LO trim of the first LO to adjust the first carrier frequency to match, within a threshold tolerance, the second carrier frequency; and
   wherein the radio is to transmit, to the access point, a protocol data unit frame using the trimmed first LO, the protocol data unit frame to facilitate the access point to, within the multi-user transmission mode, synchronize concurrent reception of multiple uplink transmissions from the plurality of wireless devices.

2. The wireless device of claim 1, wherein the control logic is implemented in at least one of a microcontroller or hardware, and wherein the control logic is to continuously trigger the LO trim of the first LO on a per-frame basis in response to detecting changes to the CFO during transmission of multiple protocol data unit frames to one or more access points.

3. The wireless device of claim 1, wherein the control logic is further to:
   calculate an LO trim value based on the CFO after trigger frame reception and content validation at a medium access control level;
   store a default phase-locked loop (PLL) frequency for the first LO; and
   trigger the LO trim of the first LO in sufficient time that the first LO settles before an end of a short interface space (SIFS) time period.

4. The wireless device of claim 1, wherein the radio further comprises a radio frequency (RF) phase-locked loop (PLL) that includes the first LO, and wherein the control logic is further to:
   calculate an updated RF PLL frequency based on the CFO;
   trigger the RF PLL to operate at the updated RF PLL frequency in response to the LO trim; and
   after transmission of the protocol data unit frame, cause the RF PLL to operate at a default RF PLL frequency.

5. The wireless device of claim 1, wherein the radio further comprises a radio frequency (RF) phase-locked loop (PLL) that includes the first LO, and wherein the control logic is further to:
   determine whether the CFO is greater than a threshold value;
   in response to the CFO not being greater than the threshold value, employ digital pre-correction to the protocol data unit frame; and
   in response to the CFO being greater than the threshold value:
   calculate an updated RF PLL frequency based on the CFO; and
   trigger the RF PLL to operate at the updated RF PLL frequency in response to the LO trim.

6. The wireless device of claim 1, wherein the control logic is further to:
   determine that the LO trim is insufficient to satisfy a target residual frequency offset value when transmitting to the access point;
   calculate a digital pre-correction offset required to satisfy the target residual frequency offset value; and
   cause digital up-conversion, using the digital pre-correction offset, of a waveform driving digital processing of the protocol data unit frame.

7. The wireless device of claim 1, wherein the control logic is configured to adjust the first carrier frequency of the first LO to within a few hertz of a target frequency associated with the second carrier frequency.

8. A wireless device comprising:
a radio comprising:
a radio frequency phase-locked loop (RF PLL);
an analog-to-digital converter (ADC) coupled to a demodulator that is driven by the RF PLL;
a digital-to-analog converter (DAC) coupled to a modulator that is driven by the RF PLL; and
an analog front end PLL to generate a clock to drive the ADC and the DAC; and
trim logic coupled to the RF PLL and the analog front end PLL, the trim logic to:
determine, from a received trigger frame, a carrier frequency offset (CFO) between a first carrier frequency of the RF PLL and a second carrier frequency of a local oscillator (LO) of an access point operating in a multi-user transmission mode;
trigger, based on the CFO, a first trim of the RF PLL to adjust the first carrier frequency to match, within a threshold tolerance, the second carrier frequency; and
trigger, based on the CFO, a second trim of the analog front end PLL to support meeting the threshold tolerance; and
wherein the radio is to transmit, to the access point, a protocol data unit frame using the trimmed RF PLL.

9. The wireless device of claim 8, further comprising:
receive (Rx) processing hardware coupled to the ADC and the trim logic; and
transmit (Tx) processing hardware coupled to the DAC.

10. The wireless device of claim 8, wherein the trim logic is to continuously trigger the first trim of the RF PLL and the second trim of the analog front end PLL in response to detecting changes to the carrier frequency offset during transmission of multiple protocol data unit frames to the access point.

11. The wireless device of claim 8, wherein the trim logic is further to:
calculate an LO trim value based on the CFO after trigger frame reception and content validation at a medium access control level;
store a default phase-locked loop (PLL) frequency for the RF PLL; and
trigger the first trim of the RF PLL in sufficient time that the RF PLL settles before an end of a short interface space (SIFS) time period.

12. The wireless device of claim 8, wherein the trim logic is further to:
calculate an updated RF PLL frequency based on the CFO;
trigger the RF PLL to operate at the updated RF PLL frequency in response to the first trim of the RF PLL; and
after transmission of the protocol data unit frame, cause the RF PLL to operate at a default RF PLL frequency.

13. The wireless device of claim 8, wherein the trim logic is further to:
determine whether the CFO is greater than a threshold value;
in response to the CFO not being greater than the threshold value, employ digital pre-correction to generation of the protocol data unit frame; and
in response to the CFO being greater than the threshold value:
calculate an updated RF PLL frequency based on the carrier frequency offset; and
trigger the RF PLL to operate at the updated RF PLL frequency in response to the first trim of the RF PLL.

14. The wireless device of claim 8, wherein the trim logic is further to:
determine that the first trim and the second trim are insufficient to satisfy a target residual frequency offset value when transmitting to the access point;
calculate a digital pre-correction offset required to satisfy the target residual frequency offset value; and
cause digital up-conversion, using the digital pre-correction offset, of a waveform driving digital processing of the protocol data unit frame.

15. A method comprising:
detecting, by control logic coupled to a radio having a first local oscillator (LO), that a preamble of a trigger frame received from an access point has been processed, the access point operating in a multi-user transmission mode and the trigger frame being directed at a plurality of wireless devices;
estimating, based on information derived from the trigger frame after preamble processing, a carrier frequency offset (CFO) between a first carrier frequency of the first LO and a second carrier frequency of a second LO of the access point;
determining a LO trim value based on the CFO; and
causing an adjustment, by the control logic, using the LO trim value, to the first carrier frequency of the first LO in advance of the radio transmitting, to the access point, an uplink protocol data unit frame configured to facilitate the access point to, within the multi-user transmission mode, synchronize concurrent reception of multiple uplink transmissions from the plurality of wireless devices.

16. The method of claim 15, further comprising continuously adjusting the LO trim value of the first LO on a per-frame basis in response to detecting changes to the CFO during transmission of multiple uplink protocol data unit frames to one or more access points.

17. The method of claim 15, wherein determining the LO trim value comprises estimating a shift in the first carrier frequency required so that the first carrier frequency matches the second carrier frequency within a threshold tolerance.

18. The method of claim 15, further comprising, before causing the adjustment:
determining that a frame sequence check as passed;
receiving a trigger frame from the access point; and
performing content validation of the trigger frame.

19. The method of claim 15, further comprising:
storing, before causing the adjustment, a default phase-locked loop (PLL) frequency for the first LO; and
triggering an LO trim of the first LO in sufficient time that the first LO settles before an end of a short interface space (SIFS) time period.

20. The method of claim 15, further comprising:
after causing the adjustment, causing the radio to transmit, to the access point, the uplink protocol data unit frame; and
after transmission of the uplink protocol data unit frame, restoring a default phase-locked loop (PLL) frequency to the first LO.

* * * * *